United States Patent [19]

Diels et al.

[11] Patent Number: 5,363,192
[45] Date of Patent: Nov. 8, 1994

[54] MODE-LOCKED ACTIVE GYRO SOLID STATE LASERS

[75] Inventors: Jean-Claude M. Diels; Michael L. Dennis, both of Albuquerque, N. Mex.

[73] Assignee: Honeywell Inc., Minneapolis, Minn.

[21] Appl. No.: 722,754

[22] Filed: Jun. 28, 1991

[51] Int. Cl.$^5$ .......................... H01S 3/10; G01C 19/66
[52] U.S. Cl. ...................................... 356/350; 372/94
[58] Field of Search .................. 356/350; 372/94; 385/1.5; 359/578, 583

[56] References Cited

U.S. PATENT DOCUMENTS

| | | | |
|---|---|---|---|
| 4,400,814 | 8/1983 | Fork et al. | 372/94 |
| 4,525,843 | 6/1985 | Diels | 372/94 |
| 4,658,401 | 4/1987 | Segre et al. | 372/94 |
| 5,148,237 | 9/1992 | Schaefer | 356/350 |
| 5,191,390 | 3/1993 | Diels et al. | 356/350 |

OTHER PUBLICATIONS

Diels et al; Proc. of the 7nth Int. Symp, Oct. 7–10, 1991, 10p. pp. 133–138; abst. supplied herewith.

Dennis et al; Opt. Lett., vol. 16, #7, pp. 529–531, Apr. 1, 1991; abst. only supplied herewith.

Diels, NTIS AD-A220832/o/XAB, Feb. 1990, 20 p, Final Report; abst. supplied herewith.

Diels et al; J. Opt. Soc. Am.B., vol. 2, #4, pp. 680–686, Apr. 1985.

"Degenerate four-wave mixing of femtosecond pulses in an absorbing dye-jet", Diels, et. al., Journal of the Optical Society of America B, vol. 3, pp. 535–543 (1986).

*Primary Examiner*—Nelson Moskowitz
*Attorney, Agent, or Firm*—John G. Shudy, Jr.

[57] ABSTRACT

A ring laser gyro that minimizes and avoids the effects of lock-in and backscatter. A ring laser is pumped in a lasing cavity with a mode-locked laser. Dual counterrotating pumped pulses are precisely positioned to avoid overlay in optical elements that contribute to lock-in and backscatter. The position of the stimulated counter rotating laser beams is controlled by two methods. In the first method the pumped pulses are synchronized with a wave propagation delay line. In the second method the pumped pulses are chopped by an acousto-optic modulator shutter to precisely time the location of the pumped pulses. Both methods are can be combined to achieve a hybrid synchronized and acousto-optic modulated approach.

20 Claims, 9 Drawing Sheets

MODE-LOCKED ACTIVE GYRO SOLID STATE LASERS

FIELD OF THE INVENTION

The present invention is directed to the field of lasers and, more particularly, to the field of solid state laser gyros.

BACKGROUND OF THE INVENTION

Today's He—Ne laser gyros dominate the inertial navigation market world-wide. Such laser gyros, commonly known as ring laser gyros or RLG's, are approaching a ceiling in technical development and there is relatively little room left for improvement. It is therefore a primary motivation of the instant invention to provide alternate conceptions of ring laser gyros, rather than to attempt to push further the limits of a technology which is nearing perfection.

Important goals to be achieved for the next generation of rotational sensors include:

Smaller size;
All solid state design;
Reduced noise (hence, higher accuracy); and
Lower cost.

The first two goals suggest the use of integrated optoelectronics. Unfortunately, the use of solid state lasers implies generally large scattering, hence a large dead band, and large homogeneous broadening, which tends to make ring laser operation unidirectional. The problems associated with a large dead band are discussed further immediately below as they relate to the "lock-in" phenomenon.

Ring laser gyros typically include a beam path, usually some form of cavity, along which two oppositely traveling laser beams propagate. A common problem in all ring laser gyros is known as "lock-in" which results in an undesirable dead band characteristic. As a ring laser gyro is rotated, the cavity round trip time or path length becomes different for the two oppositely traveling beams. This implies that the two oppositely traveling beams have to assume different frequencies. If portions of each of the beams are allowed to exit the cavity and are mixed, a beat frequency can be detected that is proportional to the applied rotation rate. This is the ideal laser gyro. Unfortunately, due to backscattering of one of the beams into the other there is a coupling of the two oppositely traveling beams. At low rotation rates this coupling causes both of the oppositely traveling beams to assume the same frequency and the beat frequency disappears. This frequency synchronization of the oppositely traveling beams is termed "lock-in".

U.S. Pat. No. 4,525,843 to Diels provides a phase conjugated coupling between the counter propagating beams of a ring laser which reduces the lock-in threshold and makes an homogeneously broadened solid state laser a suitable for use as a laser gyro. As a result, it is possible to make a compact active laser gyro with solid state and optical integrated circuit lasers.

As can be seen from the above discussion, the coupling between counterpropagating beams in the gyro is responsible for the lock-in phenomenon. It is a well established fact that, in short pulse lasers (i.e. a laser having a pulse width substantially shorter than the path length), the coupling between counterpropagating beams is restricted to the region of overlap of the counterpropagating beams or pulses. The overlap region can be very small if the circulating energy is concentrated in ultra-short pulses. This property was of little practical importance when investigated in the late 1960's because the shortest laser pulses available at the time were of length comparable to that of the laser cavity. This approach has to be reconsidered now that ultra-short pulses can be generated with a spatial extension in the micron range.

Ideally, the pulse overlap is to occur in a region of minimal scattering. A primary object of the instant invention is thus to prevent the pulses from overlapping in the laser gain medium which is a region of maximum scattering. One possibility used in the prior art employed a type of coupling to increase the overlap probability of two continuous wave beams without a tendency to lock their phases. Degenerate four wave mixing provides such a coupling. Saturable absorption is another means of forcing the two pulses to meet at a specified location. Therefor the invention is motivated by the need to precisely time the propagation of a set of pumped pulses to avoid lock-in and backscatter.

SUMMARY OF THE INVENTION

The invention provides an improved ring laser gyro in which the effects of backscatter and lock-in are minimized and avoided. The invention prevents the pumped pulses from overlapping in the laser gain medium which is a region of maximum scattering. One aspect of the present invention provides an approach which uses, in addition to gain switched operation, a shutter, called an acousto-optic modulator, operating at a different frequency, and which is properly de-phased with respect to the gain modulation.

It is an object of the invention to provide an improved ring laser gyro.

It is a further object of the invention to provide an improved ring laser gyro that is smaller in size.

It is a further object of the invention to provide a ring laser gyro that is all solid state in design.

It is yet a further object of the invention to provide an improved ring laser gyro that has reduced noise with associated higher accuracy.

It is a further object of the invention to provide an improved ring laser gyro that is lower in cost than the prior art through the use of less costly optics.

It is a further object of the invention to provide a ring laser gyro that uses integrated optical electronics.

It is a further object of the invention to provide an improved ring laser gyro that uses integrated optics and solid state lasers that also reduces the amount of scattering by avoiding pulse collisions in high scattering elements.

It is yet a further object of the invention to provide an improved compact active laser gyro with solid state and optical integrated circuit lasers.

It is yet a further object of the invention to provide an improved ring laser gyro that prevents pulses from overlapping in the laser gain medium.

It is a further object of the invention to provide an improved ring laser gyro that employs a broad band coupler to split a pump pulse from a laser diode and injected into a fiber laser cavity.

It is yet a further object of the invention to provide an improved ring laser gyro that has a delay line made of any waveguide and laser ring comprising a waveguide made which could be a fiber or be made of rare earth doped glass or a glass fiber with a nonlinear gain mechanism with a ring topology.

It is yet a further object of the invention to provide an enhanced ring laser gyro that eliminates any coupling possibilities of two laser waves through a pumping channel and through backscattering at a coupler.

It is yet a further object of the invention to provide an improved ring laser gyro that is both synchronously pumped and acousto-optically modulated.

It is yet a further object of the invention to provide an improved ring laser gyro that utilizes a colliding pulse mode locking configuration.

It is yet a further object of the invention to provide an improved ring laser gyro that controls the point of crossing of two pulses by using an acousto-optic modulator.

It is yet a further object of the invention to provide an improved ring laser gyro that uses an acousto-optic modulator shutter operating at a different frequency than the gain modulation frequency.

Other objects, advantages and features of the invention will be apparent through the description of the preferred embodiment, claims and drawings herein wherein like numerals refer to like elements.

DESCRIPTION OF THE PREFERRED EMBODIMENT

Various alternate embodiments of the invention are possible including the Synchronous Pumping technique, Direct Modulation technique, Synchronously Pumped/Amplitude or Phase Modulation technique, Colliding Pulse Mode Locking technique, Two Photon Absorber technique, and the Gain Switched Acousto-Optic or Electro-Optic Modulation technique.

Synchronous Pumping

Figure 1A:
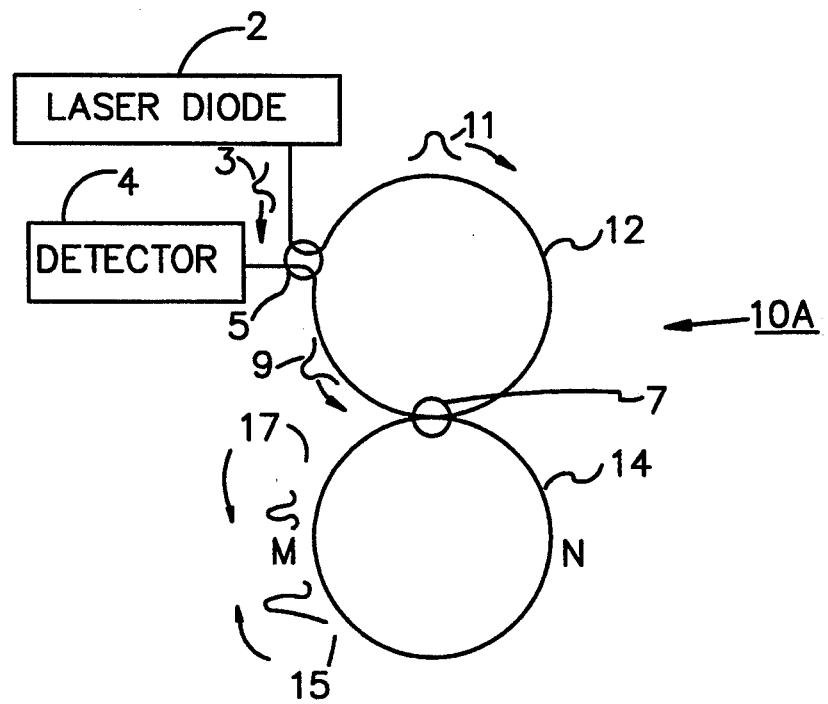
FIG. 1A is a schematic drawing of one embodiment of a ring laser gyro employing the synchronous pumping technique of the invention wherein a broadband coupler is employed to split a pump pulse from a laser diode.

The synchronous pumping technique of the method of the invention exploits the use of the physical time delays inherent in wave propagation to correctly time the pump and laser signals. FIG. 1 shows a schematic drawing of one embodiment of a ring laser gyro employing the synchronous pumping technique of the invention. In the example embodiment shown in FIG. 1, the ring laser gyro 10A comprises a pump ring 12, a laser ring 14, a photodetector 4, a mode locked laser source 2, a pump/laser coupler 7 and a broadband coupler 5. Those skilled in the art will appreciate that it is intended in this description that the pump ring 12 and the laser path 14 may be any medium suitable for the propagation of a laser beam including air, fiber and integrated optics waveguides, for example, as well as other known means of providing a propagation path for a laser beam. In one example, the pump ring 12 and the laser ring 14 may advantageously comprise a waveguide such as rare earth doped glass or nonlinear optics gain (Ranan or Brillown) with a ring topology. The ring topology may be of any suitable geometric shape as, for example, triangular, circular, four-sided or other polygonal shapes. The waveguide may further advantageously be in the form of a fiber, or an integrated optics waveguide. The laser source 2 may be any suitable well known source such as a semiconductor laser, a laser diode, a mode locked gas discharge laser or mode locked dye laser. The detector 4 may be any suitable photodetector well known in the art. The coupler 5 may advantageously be a wavelength selective directional coupler.

In operation, the mode locked laser source 2, which is advantageously a pulse laser diode, provides a primary pumping pulse 3 to coupler 5. The coupler 5 splits equally the primary pump pulse 3 from the laser source 2 into a first pump pulse 11 and a second pump pulse 9. It is advantageous to have the coupler 5 be broadband such that the coupler equally splits pump signals passing through it. The coupler 5 is advantageously 50% broadband. An equal amount of the laser signals from laser source 2 will thereby be transmitted through connector 5 to pump ring 12 in both directions. The function of pump ring 12 is to delay the two pump pulses 11, and 9 such that the two stimulated laser pulses 15 and 17 do not meet at the pump/laser coupler 7 as explained further below.

The coupler B should equally split pump signals at predetermined pump wavelengths. Each of the laser diode pulses 9 and 11 split by the broadband coupler 5 will synchronously pump the ring laser gyro 10A, producing pulses in the laser ring 14 that meet at positions M and N which are called overlap regions.

In operation, the laser ring 14 is pumped at a selected pump wavelength through the coupler 5 by the laser diode 2 operating at a shorter wavelength. The function of the coupler 5 is to transfer substantially all the energy of the short pulse 11, and short pulse 9, for instance from a semiconductor laser, from the waveguide 12 into the waveguide 14.

The wavelength selectivity of the pump/laser coupler 7 should be such that all of the pump pulses are transmitted and only a minimum amount of useful signal at the gyro laser wavelength is leaked from the laser ring 14 into the pump ring 12. Thus the invention provides for a minimized power drain from the laser ring 14 to supply a sense signal at the detector 4.

The overlap positions M and N are critical in the operation of the ring laser gyro 10A. At locations M and N the backscattering caused by the overlapping of laser pulse 17 and laser pulse 15 may induce a coupling of the two counterpropagating laser pulses 15 and 17. As discussed hereinabove, such coupling is responsible for "lock-in" or suppression of the gyroscopic response.

For optimum performance of the gyro high optical quality of the waveguide is required over the regions around M or N, spanning a pulse length $L_p$, where the pulse length is proportional to the laser pulse duration:

$L_p = c\ \tau$,
$L_p$—pulse length
$\tau$—laser pulse duration
c—speed of light in the waveguide It should be noted that, in the approximation of negligible dispersion between the two modes, the laser pulses 15 and 17, and the pump pulses 9 and 11, all overlap simultaneously in broadband coupler 5. Therefore, the detector 4 will receive simultaneously the pulses 15 and 17 originating from the counter rotating modes of the laser gyro. In the presence of rotation, a beat note—which is the gyroscopic response—will appear on detector 4.

Figure 1B:
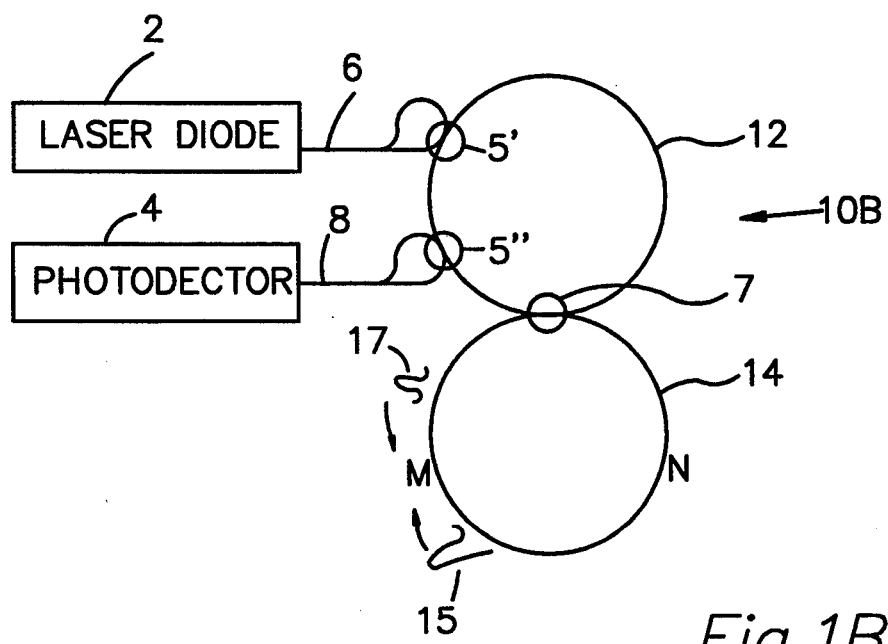
FIG. 1B is a schematic drawing of one embodiment of a ring laser gyro employing the synchronous pumping technique of the invention wherein the laser gyro configuration is modified for large group velocity dispersion.

Referring now to FIG. 1B which shows a schematic drawing of one alternate embodiment of a ring laser gyro 10B employing the synchronous pumping technique of the invention wherein the laser gyro configuration is modified for large group velocity dispersion. In the case of fiber waveguides, where it is convenient to make the loop very large, the group velocity difference of the pump and laser wavelengths may differ sufficiently so that the pulses may no longer overlap at the broadband coupler 5. In that case, the broadband coupler 5 may advantageously be replaced by two wavelength selective 50% couplers 5' and 5" at the pump and laser wavelength, respectively.

While increasing the complexity of the system, this particular option enhances the performance of the lasers, by eliminating any coupling possibility of the two laser waves 15 and 17 through the pump channel 7 and through backscattering at the broadband coupler 5. Indeed, the primary source of coincident backscattering (i.e. backscattering pulse coincident with counterpropagating pulses) would be at broadband coupler 5. The amount of coupling is reduced by the square of the transmission coefficient of the laser output coupler 5'. As pointed out above, group velocity dispersion in the waveguides can be exploited to eliminate this problem.

In the case of equal group velocities at the laser and pump wavelengths, 50% of the energy of the laser pulses will travel to the pump ring 12 and be reflected back into the laser ring 14. If the length of the detection waveguide 8 and pump waveguide 6 is chosen to be (n*cP)/8(n=odd integer, c=speed of light in the waveguide), the reflected pulse will have a maximum separation from the circulating one at the next round-trip (but be coincident at the following round-trip). If $cT \ll P$, more isolation is possible by choosing the detection and pump channels to be $P/4 - Tc$ where P is the perimeter of the ring.

In one example embodiment the laser 10A, for example, may advantageously be constructed from two fibers, a first fiber comprising the laser ring 14 and a second fiber comprising the pump ring 12. The fiber comprising the laser ring may be cleaved and polished on its two ends. The two ends may then be butted together at a point of the ring. The pump ring 12 may also have cleaved and polished ends for laser pulse input and output from the laser diode 2. Pump/laser coupler 7 may be constructed directly from the fibers by polishing their sides and optically contacting the polished surfaces of the pump ring 12 fiber and laser ring 14 fiber.

Figure 1C:
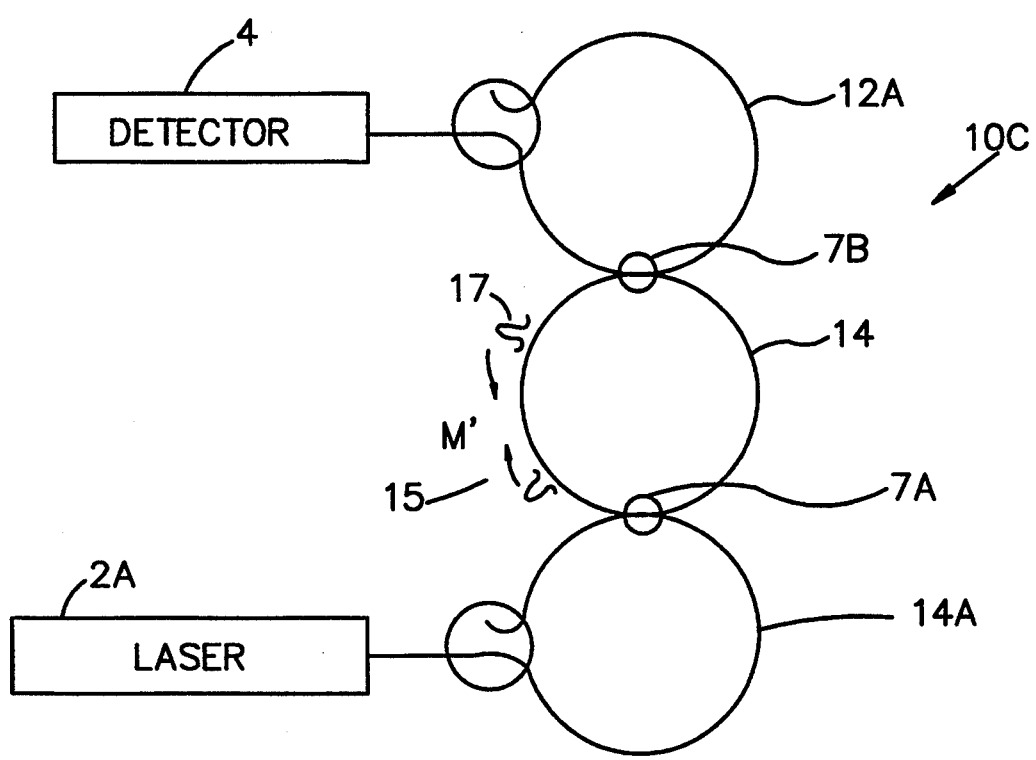
FIG. 1C is a schematic drawing of one embodiment of a ring laser gyro employing the synchronous pumping technique of the invention wherein a pumping source is employed to stimulate counter rotating beams in a waveguide.

Referring now to FIG. 1C which shows a schematic drawing of an additional alternate embodiment of a ring laser gyro 10C employing the synchronous pumping technique of the invention where it is shown that the detection and pumping paths can be different. In this alternate embodiment of the invention a direct laser source 2A, such as a semiconductor laser, pumps the laser ring 14 through pump loop 14A to generate two counterrotating beams 17 and 15. A small portion of the beams 15 and 17 are leaked to the sense ring 12A. The photodetector 4 is positioned such that both beams travel a similar distance from stimulation source M'. Thus this embodiment of the invention provides beam overlap at M' that avoids overlap in the couplers 7A and 7B.

Direct Modulation

In addition to the synchronous pumping technique previously described, other active mode locking techniques employing direct modulation of the phase or amplitude of the counterpropagating waves can be employed to generate short pulses in a solid state ring laser gyroscope. For example, FIG. 2A is a schematic drawing of an alternative embodiment of the invention employing an acousto-optic modulator.

Figure 2A:
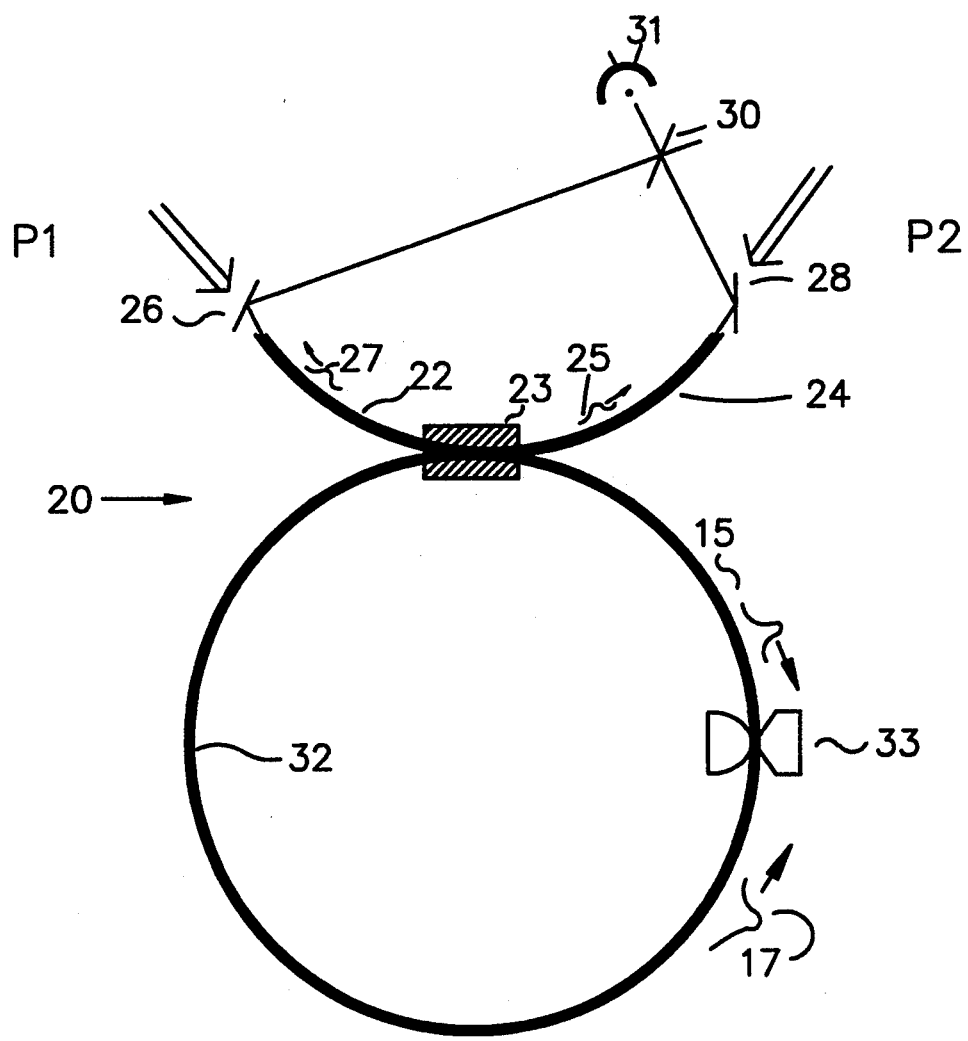
FIG. 2A is a schematic drawing of an alternative embodiment of the invention employing an acousto-optic modulator.

The ring laser gyro 20 shown in FIG. 2A comprises continuous wave pumping beams P1 and P2 which impinge on first and second mirrors 26 and 28 respectively and enter pumping paths 22 and 24. Although it will be understood that the invention is not limited to fibers, the pumping paths 22, 24 may advantageously comprise lengths of optical fibers containing a suitable gain dopant or utilizing a suitable nonlinear gain mechanism. A detector 31 is located in line to receive radiation from a beam splitter 30 which, in turn, receives radiation from the first and second mirrors 26, 28. A laser ring 32 is coupled by coupler 23 to the pumping paths 22, 24. A modulator 33 is placed at a predetermined location on the laser ring 32 to provide acousto-optic modulation of the counterpropagating laser beams 15 and 17, pumped into the laser ring 32 from pumps P1 and P2. An acousto-optic phase modulator of the type manufactured by IntraAction Corp. of Bellwood Ill. Model ML-1233D was employed in one example of the invention constructed at the University of New Mexico Department of Physics and Astronomy. Other such acousto-optic modulators and equivalent devices are known in the art.

In operation, continuous wave (CW) pumping beams P1 and P2 are coupled into the ring laser gyro 20 therein via a coupler 23, exciting the gain mechanism in the fibers. The modulator 33 is driven at a frequency equal to the longitudinal mode spacing of the fiber resonator (i.e., c/nP, where c is the speed of light, n is the refractive index of the fiber, and P is the perimeter of the fiber loop) thus mode lock-ing the laser to generate ultrashort pulses 15 and 17. The modulator is positioned a distance P/4 from the coupler 23 to minimize backscattering from each direction into its opposite direction. A small fraction of the pulses 15 and 17 is coupled out of the laser 32 at coupler 23 through the two pumping fibers 22 and 24. The output pulses 25 and 27 may then be mixed with the appropriate delays upon the detector 31 to obtain the beat frequency between the oppositely traveling laser beams 15 and 17. Of course, a fiber delay loop of the type illustrated in FIG. 1 could be used here as well.

Figure 2B:
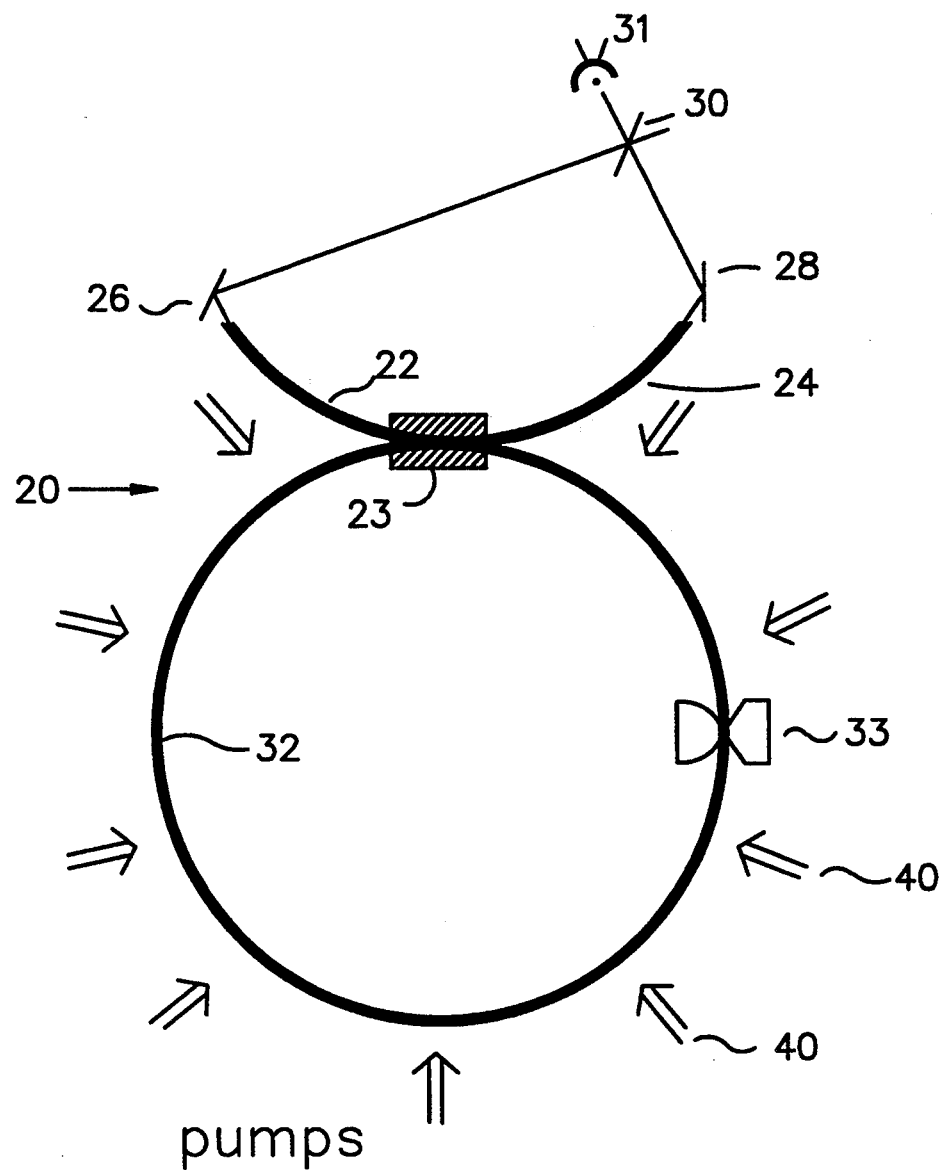
FIG. 2B is a schematic drawing of another alternative embodiment of the invention employing an acousto-optic modulator and side pumping.

Note that with CW pumping there is no longer any need for the longitudinal pumping geometry described above. Side pumps 40 as illustrated in FIG. 2B offer the advantage of alleviating the alignment and positioning problems associated with coupling beams into optical fibers as illustrated in FIG. 2A, especially appropriate to monolithic gain elements, dye lasers and solid state lasers.

Figure 2C:
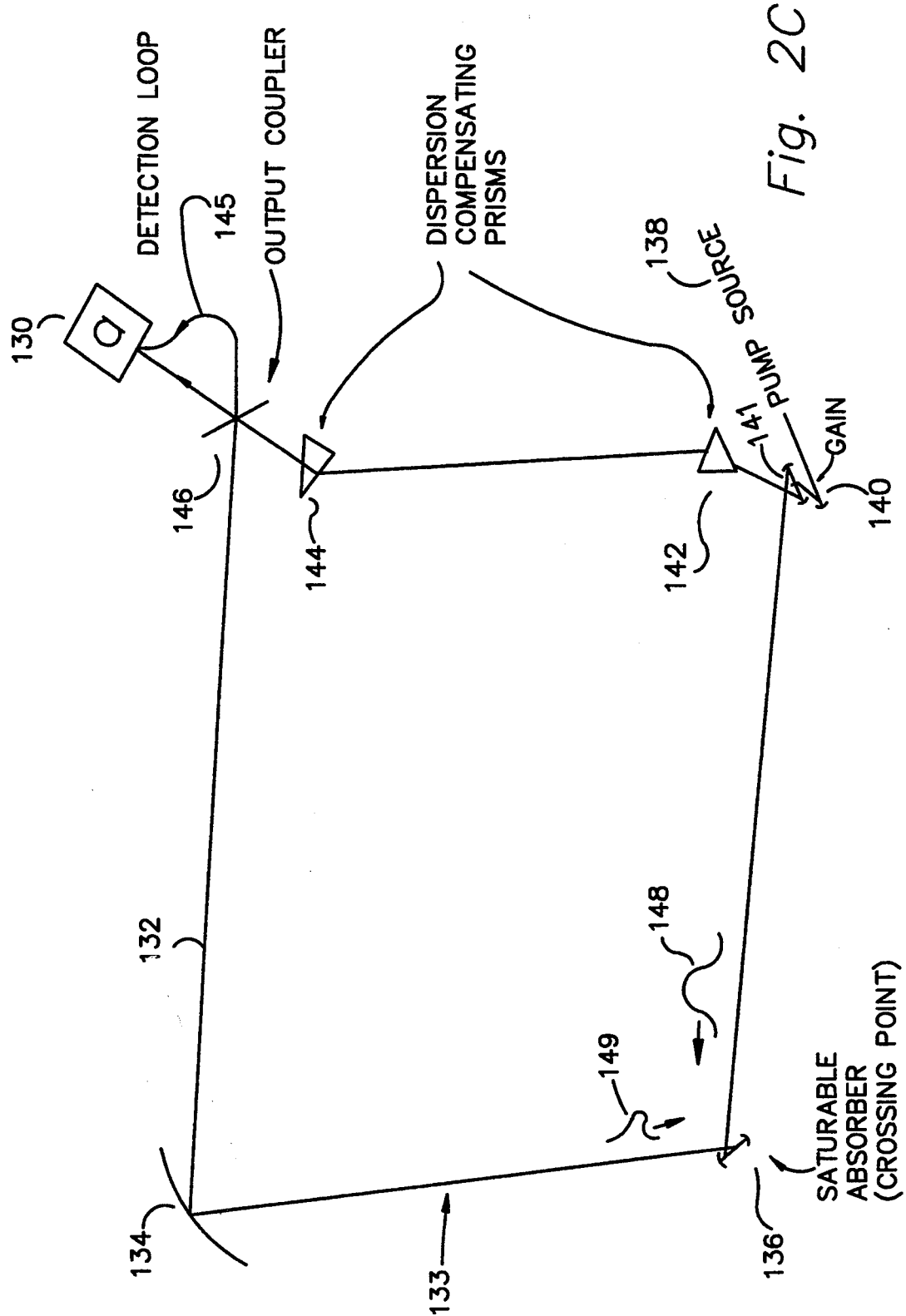
FIG. 2C is a schematic drawing of another alternative embodiment of the invention employing a resonator with mirrors and discrete gain/absorbing elements.

FIG. 2C shows yet another alternative embodiment of the invention in schematic form. In FIG. 2C a saturable absorber, 136, a beam reflector 134, an optical coupler 146, and an optical detection loop 145, combine to direct a laser beam 132 to detector 130. The beam originates from a pumping source 138 which travels through a reflector 140 which directs the beam 132 to a gain medium 141. A counter propagating beam 132 is then generated which also goes through dispersion compensating prisms 142 and 144.

This embodiment of the invention provides a resonator 133 with mirrors 134, 146, 140 and discrete gain/absorbing elements. The laser beam 132 is mode-locked through the presence of the saturable absorber 136. The saturable absorber 136 also is made to be the crossing point of the pulses 148 and 149. The mode-lock nature of the beam 132 results in a gyro response which is further elucidated in an article by Jean-Claude M. Diels entitled "Femtosecond Ring Laser: A Potential New Laser Gyro" Optics Letter, Volume 16, No. 17, Pages 529–531, Apr. 1, 1991 which is hereby incorporated by reference.

Synchronously Pumped, Acousto-Optic Hybrid

Figure 3:
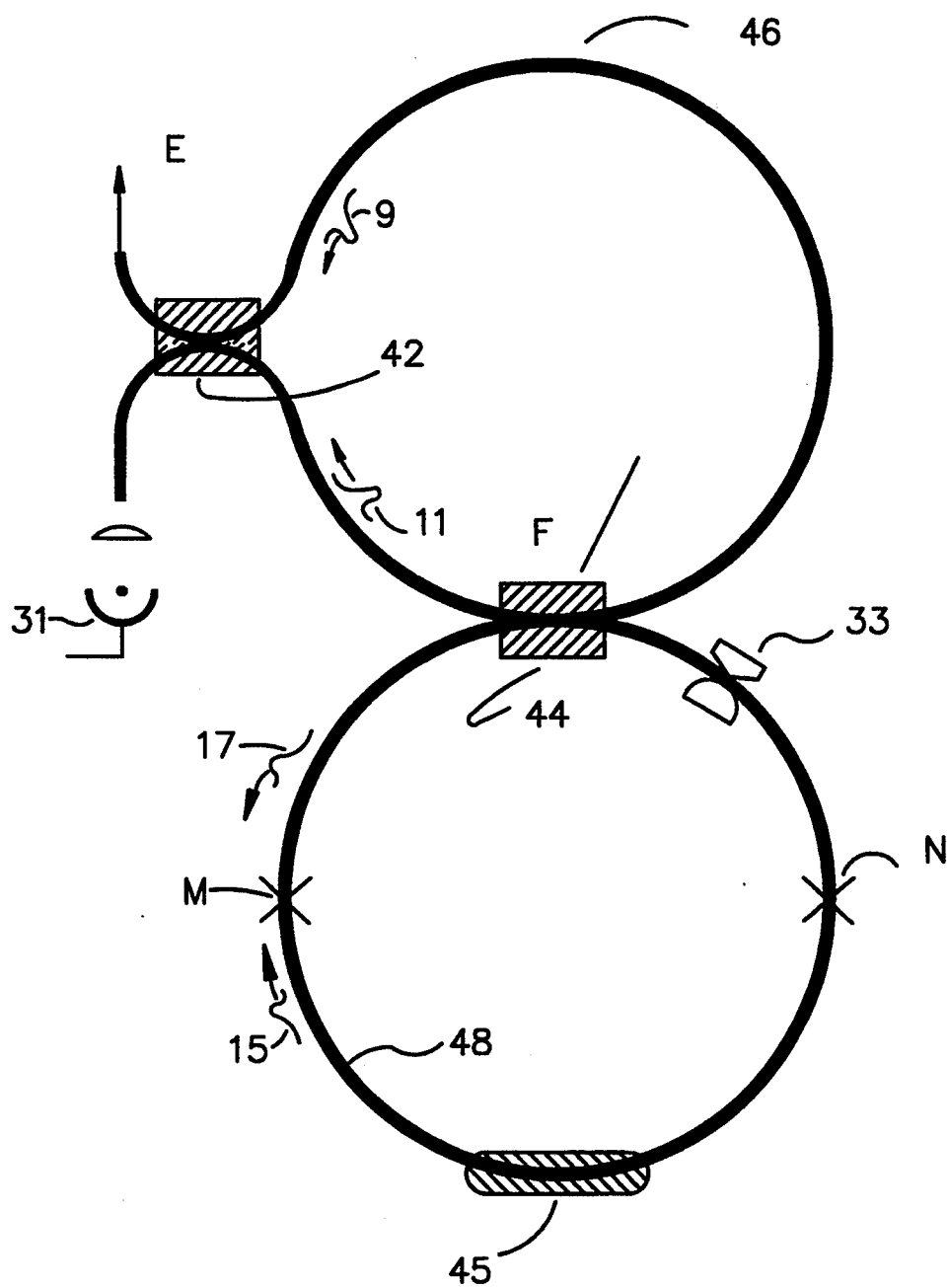
FIG. 3 is a schematic drawing of another alternative embodiment of the invention employing an acousto-optic modulator and integrated optics.

A hybrid configuration which is both synchronously pumped and acousto-optically modulated is illustrated in FIG. 3. Such an arrangement has the advantage that the pulses may be so timed as to meet away from both the coupler 44 and modulator 33. The output coupling loop is as in FIG. 1, except that the lengths are adjusted to compensate for the shift of the pulse cross positions M and N. An alternative gain arrangement is also illustrated wherein a gain element 45 is incorporated into the laser ring 48. The gain element 45 could be an injection laser, stoichiometric rare earth containing crystal, a short section of heavily doped fiber, or any comparable discreet component coupled into the fiber ring resonator. The gain is pumped at a repetition rate of $D=2P/c$, that is, twice the fiber resonator repetition rate. The modulator 33 must be of an amplitude modulation type (i.e. acting as a shutter), whereas in FIG. 2A and 2B either amplitude or phase modulators could be used. The modulator 33 is driven so as to be open—that is, any light will pass—three times per fiber cavity round trip. The lengths of the fiber sections from positions E to F are arranged so that the pump pulses 9 and 11, and thus also the mode locked ring fiber laser pulses 15 and 17, in opposite directions would pass through the modulator 33 independently, thus reducing backscattering coupling between the oppositely traveling laser beams 15 and 17. The advantages of this hybrid scheme are that it allows for the use of a pump source with relatively long pulse length, thus relaxing restrictions on the stability of the repetition rate of the pump. This is true because the modulator 33 forces the mode lock-ing to generate ultra-short pulses; the pulsing of the pump source 45 only serves to prevent those pulses from crossing at the modulator 33.

Colliding Pulse Mode Locking

Another approach is that of a colliding pulse mode locking (CPM) configuration. Referring to FIG. 2A again, the modulator 33 may be replaced by a short section of fiber doped with a saturably absorbing substance, or alternatively the fiber jacket and/or cladding would be removed and the fiber core surrounded by the saturable absorber. The gain fiber could be either end or side pumped with either pulsed or CW light. As CPM dye lasers have produced the shortest laser pulses to date, this technique has the potential to yield very short fiber laser pulses which would minimize the coupling between the oppositely traveling laser beams 15 and 17. However, the doping of the fiber section or removal of the jacket or cladding may likely lead to strong backscattering at the saturable absorber which is also the pulse crossing point.

Two-Photon Absorber

Figure 4:
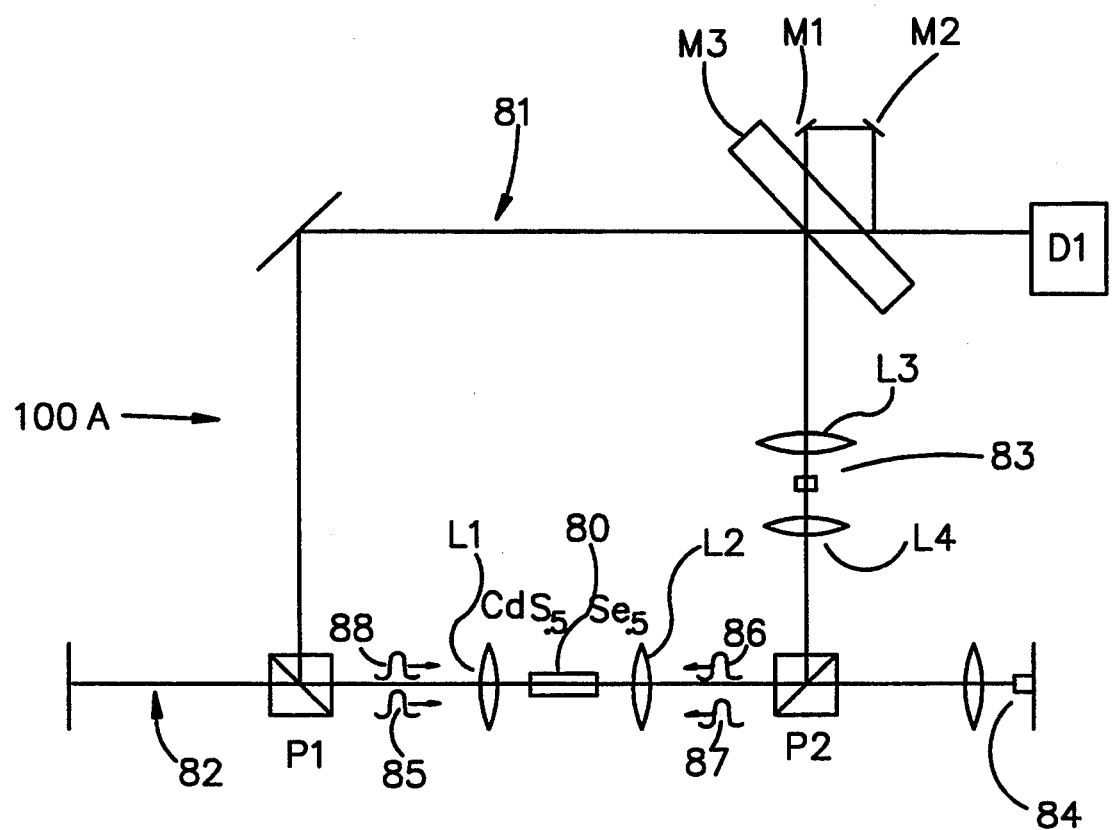
FIG. 4 is a schematic drawing of another alternative embodiment of the invention employing a mixed crystal as a nonlinear two-photon absorbing and phase conjugating element.

In the cavity sketched in FIG. 4, a mixed crystal $CdSe_{0.5}S_{0.5}$ is used as a nonlinear (two-photon absorbing) element 80. The two photon absorber 80 is common to both the ring cavity 81 and a synchronous linear cavity 82. A first pulse generator 83 is used to stimulate the ring cavity 81 and a second pulse generator 84 is used to stimulate the synchronous linear cavity 82. In the two photon absorber 80, four pulses meet: the two counter propagating pulses 85 and 87 of the ring cavity 81, and two counterpropagating pulses 86 and 88 of the linear cavity 82. The mixed crystal $CdSe_{0.5}S_{0.5}$ has a moderate and fast nonlinearity. Other materials could be used in place of $CdSe_{0.5}S_{0.5}$ such as other photorefractive materials like strontium barium niobate, or SBN used as a phase conjugating media. The function of the nonlinear element 80 is twofold. First, the four wave mixing interaction produces an additional gain, which is be adjusted to bring the cavity 81 above threshold. Because the coupling between the pulses 85 and 87 of the ring cavity is phase conjugated, the lock-in band is reduced by the coupling. The beam takes a path through the two polarizers P1 and P2 and makes a round trip through the readout mechanism M1. The laser beam from laser 84 follows a path from the end of the cavity 81 and back. The laser 84 is pulsed at twice the cavity round trip time such that the two pulses 85 and 87 simultaneously travel the path. The two pulses 85 and 87 are shown meeting in the $CdSe_{0.5}S_{0.5}$. The two laser sources 84 and 83 are comprised of a pulsed lasing source where lasing source 84 is pulsed at the same rate of lasing source 83. Pulses 88, 86, 85, and 87 mix resulting in energy transfer from pulse 88 to pulse 86 and from pulse 85 to 87 following the four wave mixing phenomenon. This results in the elimination of the deadband. A good description of the four wave mixing phenomenon can be found in an article by Jean-Claude Diels and Ian C. McMicheal entitled "Degenerate four-wave mixing of femtosecond pulses in an absorbing dye jet" which is hereby incorporated by reference. A detector D1 is positioned to receive the cw pulse and ccw pulse such that they impinge after traveling equal distances to the detector D1. In the example of FIG. 4 mirrors M1, M2 and M3 accomplish the path length control of the pulses. Those skilled in the art will appreciate that the example of FIG. 4 is by way of illustration and not limitation and that other methods of path length control may be used without deviating from the scope of the invention. In the example of FIG. 4 the ccw pulse 85 travels a path equal to the cw pulse 87 before the two interact at the detector D1. For example, the time for a pulse to travel a round trip around path 81 is approximately two nanoseconds. Due to the slightly different frequencies of pulses 85 and 87 there will be modulation at a frequency corresponding to the rotation of the gyro 100A. In the embodiment of FIG. 4 lenses L1 and L2 are used to collimate the laser pulses into the mixing cavity 80 and lenses L4 and L3 are used to collimate the beam into detector D1. Pulses 85 and 87 are amplified slightly and are phase conjugated coupled by the method of the invention.

Optical Modulation (Amplitude Modulation)

Figure 5A:
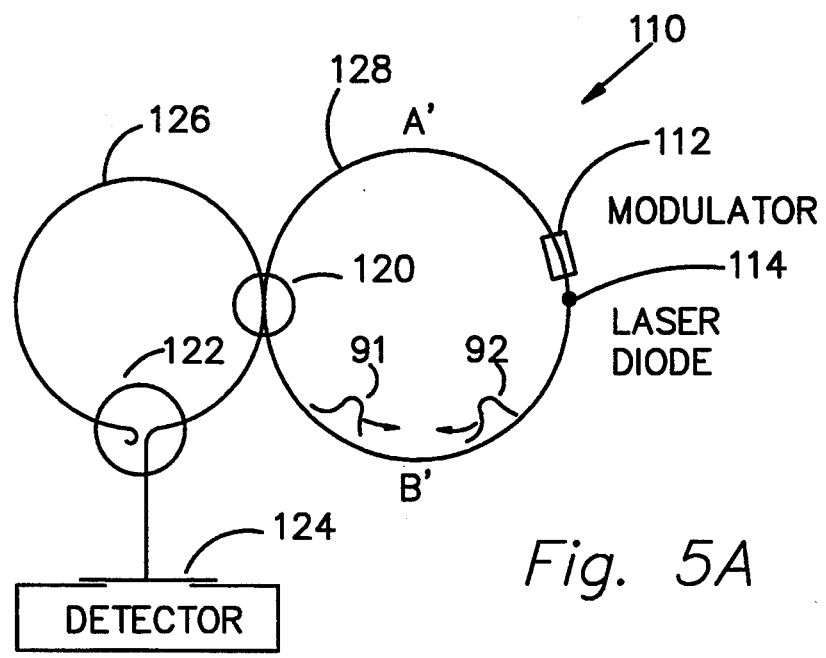
FIG. 5 is a schematic drawing of another alternative embodiment of the invention employing gain switching and acousto-optic modulation to provide simultaneous mode locking.

Now referring to FIG. 5A which shows the method of the invention in an alternative configuration. In the approach of FIG. 5A the point of crossing of the two pulses 91 and 92 in the gyro 110 is controlled by the use of an acousto-optic modulator 112. In the particular example of FIG. 5A, the laser diode 114 is gain switched at twice the cavity round-trip rate, and the acousto-optic modulator 112 is driven at 3 times the cavity rate. If the opening time of the acousto-optic modulator 112 is delayed by 1/12 of the cavity period with respect to the gain switch, the pulses will cross at points A' and B' remote from both the modulator 112 and from the laser diode 114.

Figure 5B:
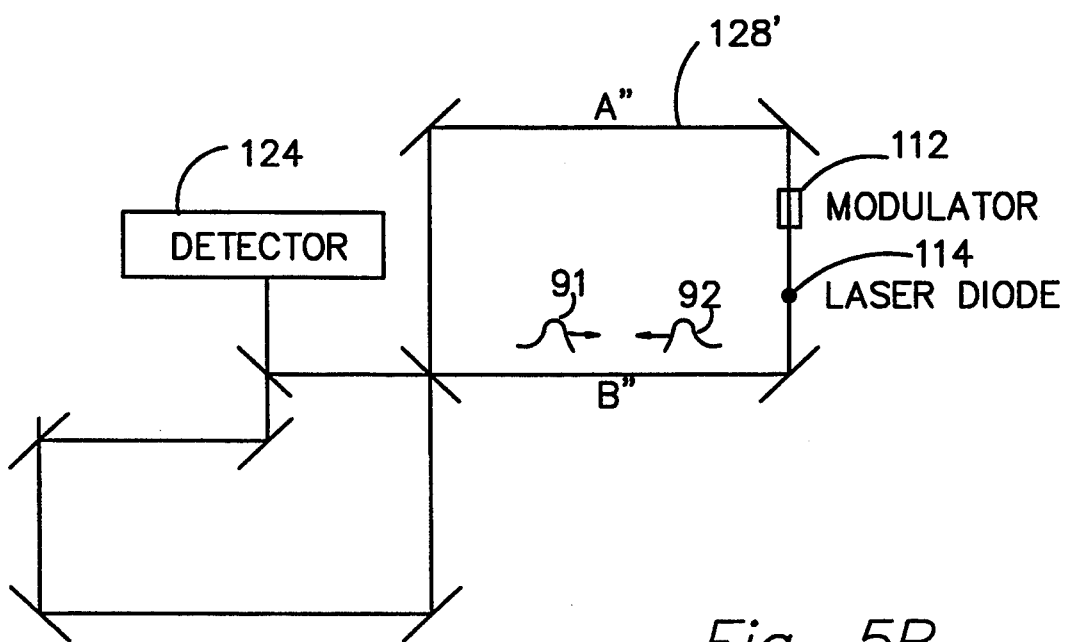

The cavity may alternately be made of bulk optics with mirrors as shown in FIG. 5B. FIG. 5B shows an alternative embodiment to the invention using a laser diode 114 and modulator 112 forming counter propagating beams 91 and 92 in lasing path 128'. In the example of FIG. 5B the laser diode 114 is gain switched at twice the cavity round trip rate, and the acousto-optic modulator 112 is driven at three times the cavity rate. If the opening time of the acousto-optic modulator 112 is delayed by one twelfth of the cavity period with respect to the gain switch as in FIG. 5A, the pulses will cross at point A" and B" remote from both the modulator 112 and the lasing diode 114.

Figure 6:
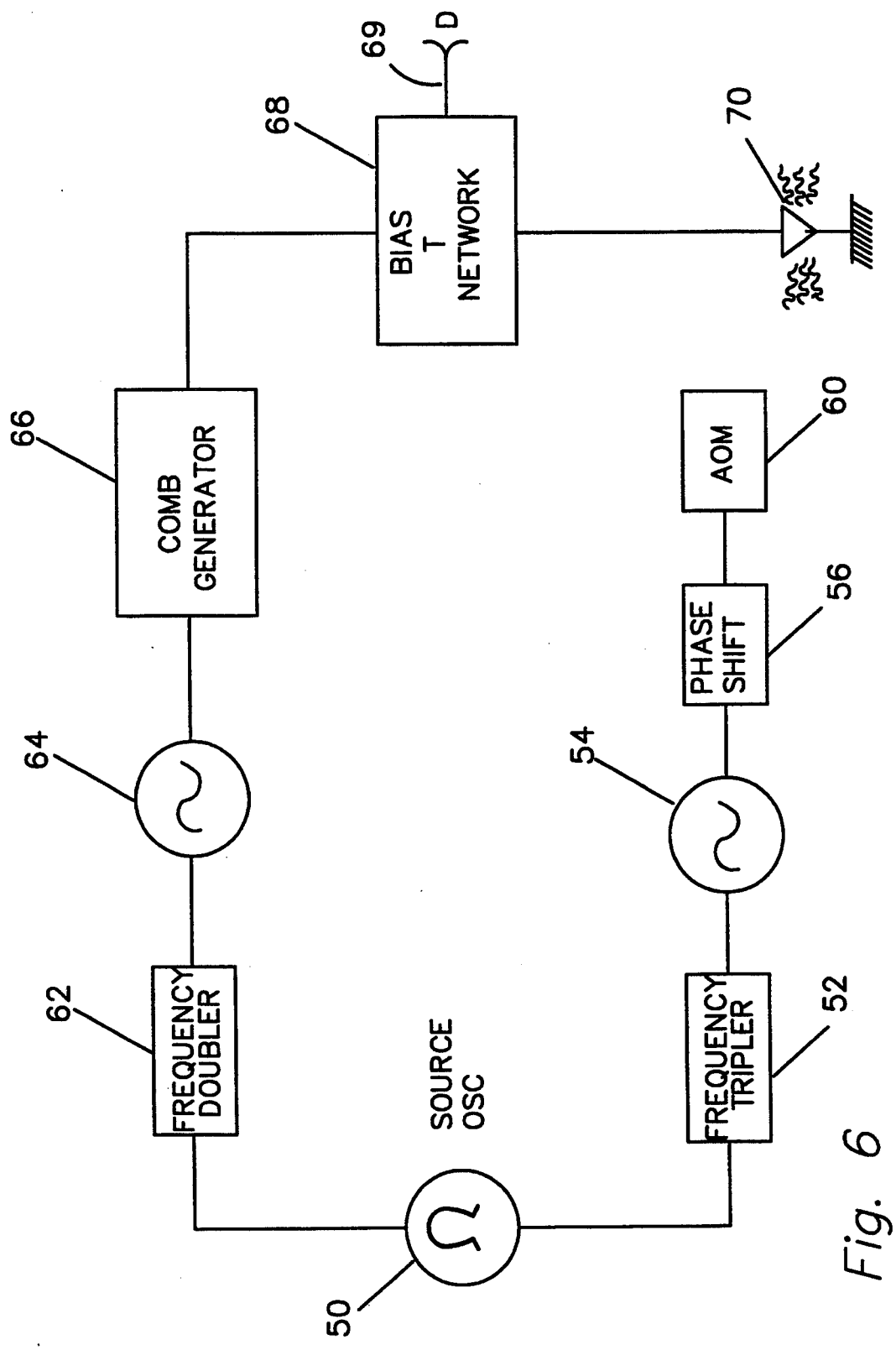
FIG. 6 is a schematic diagram of one example of the control network employed in the invention including an acousto-optic modulator.

Now referring to FIG. 6 which shows a GaAs ring laser 70, mode-locked through gain modulation where the GaAs laser 70 is powered by a Bias T Network 68 which is connected to a DC bias current. The Bias T Network is driven by a COMB generator 66. The comb generator 66 is driven by a radio frequency source 64 at the repetition rate of the diode 70 which is two times the cavity round trip rate. The RF source is driven by a frequency doubler 62 which doubles the frequency of a reference source oscillator 50. The reference source oscillator 50 also provides a signal to a frequency tripler 52 which provides signal to a second RF source 54 that is phase locked to the first RF source 64. The second RF source 54 provides a signal to be phase shifted by a delay line 56 to accomplish a 30° phase shift. The output of the phase shifter 56 is then fed to a shutter control or acousto-optic modulator (AOM) 60 which controls the various modulators of alternate embodiments of the invention discussed hereinabove.

In operation the gain switching methods of the invention apply a brief current pulse into the laser diode 70. The diode 70 is biased below the lasing threshold. A brief subnano-second pulse is coupled into the diode 70. The synchronization of the pulse is controlled by a comb generator 66 which continuously provides pulses at the driving frequency. The timing of the circuit through the control of the shutter frequency of the modulator and the control of the laser diode pulse rate combine to maintain pulse overlap in acceptable positions in the ring laser gyro of the method of the invention.

Those skilled in the art will appreciate that the successful construction of the embodiments of the invention require the construction of good optical components, in particular high quality antireflection coatings for GaAs lasers.

The invention has been described herein in considerable detail in order to comply with the Patent Statutes and to provide those skilled in the art with the information needed to apply the novel principle and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A laser gyro comprising:
   (a) a mode-locked lasing means for generating a pump pulse;
   (b) a first optical coupling means for splitting a pulse connected to the lasing means wherein the first optical coupling means splits the pump pulse into a first pulse and a second pulse;
   (c) a delay means for time delaying the first pulse relative to the second pulse;
   (d) a second optical coupling means for transmitting the first pulse and the second pulse;
   (e) a gain means for laser amplification disposed to receive the transmitted first pulse and second pulse such that the gain means lases and wherein the gain means emits a first laser pulse in response to the first pulse in a first direction and emits a second laser pulse in a second opposite direction in response to the second pulse at a different time through the second optical coupling means;
   (f) an interference means for interfering disposed to receive the first laser pulse and second laser pulse connected through the first optical coupling means, wherein the interference means generates an interference signal between the first laser pulse and second laser pulse that is positioned such that the first laser pulse and second laser pulse do not overlap in the first optical coupling means and the second optical coupling means; and
   (g) a detector means for detecting the interference signal.

2. The laser gyro apparatus of claim 1 wherein the first pulse and second pulse are substantially equal in energy.

3. The laser gyro apparatus of claim 1 wherein the mode-locked lasing means comprises a laser source selected from the group consisting of a laser diode, gas discharge laser, or a dye laser solid state gain media and homogeneously broadened media.

4. The laser gyro apparatus of claim 1 wherein the delay means comprises a wave guide selected from the group consisting of a fiber optic delay line, a rare earth doped glass, a fiber with a nonlinear gain mechanism, and integrated optics.

5. The laser gyro apparatus of claim 1 wherein the gain means is a fiber optic ring laser.

6. The laser gyro apparatus of claim 1 wherein the detector means is a photodetector.

7. A laser gyro comprising:
(a) a mode-locked lasing means for generating a first pump pulse and a second pump pulse;
(b) a first optical coupling means for transmitting the first and second pump pulses connected to the mode-locked lasing means;
(c) a first delay means for time delaying the first pulse relative to the second pulse connected to the first optical coupling means disposed to receive the first and second pump pulses;
(d) a second optical coupling means for transmitting the first and second pulses connected to the first delay means;
(e) a gain means for laser amplification disposed to receive the first pump pulse and second pump pulse such that the gain means lases and wherein the gain means emits a first laser pulse and emits a second laser pulse;
(f) a third optical coupling means for transmitting the first laser pulse and the second laser pulse connected to the gain means;
(g) a second delay means for time delaying the second laser pulse relative to the first laser pulse connected to the third optical coupling means disposed to receive the first and second laser pulses;
(h) a fourth optical coupling means for transmitting a pulse connected to the delay means and disposed to receive the first laser pulse and second laser pulse;
(i) an interference means for interfering disposed to receive the first laser pulse and second laser pulse connected through the fourth optical coupling means, wherein the interference means generates an interference signal between the first laser pulse and second laser pulse that is positioned such that the first laser pulse and second laser pulse do not overlap in the first optical coupling and the second optical coupling; and
(j) a detector means for detecting the interference signal.

8. The laser gyro apparatus of claim 7 wherein the lasing means comprises a laser source selected from the group consisting of a laser diode, gas discharge laser, or a dye laser solid state gain media and homogeneously broadened media.

9. The laser gyro apparatus of claim 7 wherein the delay means comprises a wave guide selected from the group consisting of a fiber optic delay line, a rare earth doped glass, a fiber with a nonlinear gain mechanism, and integrated optics .

10. The laser gyro apparatus of claim 7 wherein the gain means is a fiber optic ring laser.

11. A laser gyro comprising:
(a) a plurality of lasing means for generating a plurality of pump pulses;
(b) a first optical coupling means for transmitting the pump pulses;
(c) a gain means for laser amplification disposed to receive the plurality of pump pulses such that the gain means lases and wherein the gain means emits a first laser pulse and emits a second laser pulse in response to the first and second pump pulses;
(d) a shutter means for chopping the first laser pulse and second laser pulse such that the first and second laser pulses do not overlap at the first optical coupling means;
(e) an interference means for interfering disposed to receive the first laser pulse and second laser pulse connected through the first optical coupling means, wherein the interference means generates an interference signal between the first laser pulse and second laser pulse that is positioned such that the first laser pulse and second laser pulse do not overlap in the first optical coupling and the second optical coupling; and
(f) a detector means for detecting the interference signal.

12. The laser gyro apparatus of claim 11 wherein the first optical coupling means is a broadband coupler.

13. The laser gyro apparatus of claim 11 wherein the lasing means is a laser source selected from the group consisting of a laser diode, gas discharge laser, or a dye laser solid state gain media and homogeneously broadened media.

14. The laser gyro apparatus of claim 11 wherein the gain means is a fiber optic ring laser.

15. A laser gyro comprising:
(a) a lasing means for generating a first pump pulse and second pump pulse;
(b) a first optical coupling means for transmitting the first and second pump pulses;
(c) a gain means for laser amplification disposed to receive the first and second pump pulses such that the gain means lases and wherein the gain means emits a first laser pulse and emits a second laser pulse in response to the first and second pump pulses;
(d) an absorber means for saturable absorption to substantially cause the first laser pulse and second laser pulse to overlap at the absorber means;
(e) an interference means for interfering disposed to receive the first laser pulse and second laser pulse connected through the gain means, wherein the interference means generates an interference signal between the first laser pulse and second laser pulse; and
(f) a detector means for detecting the interference signal.

16. The laser gyro apparatus of claim 15 wherein the lasing means is a laser source selected from the group consisting of a laser diode, gas discharge laser, or a dye laser solid state gain media and homogeneously broadened media.

17. The laser gyro apparatus of claim 15 wherein the gain means is a fiber optic ring laser.

18. A laser gyro having a deadband comprising:
(a) a cavity lasing means for generating a first laser pulse and first counterpropagating laser pulse;
(b) a linear lasing means for generating a second laser pulse and second counterpropagating laser pulse;
(c) an absorption means for two-photon absorbing disposed to receive the first laser pulse, first counterpropagating laser pulse, second laser pulse and second counterpropagating laser pulse, and whereby the absorption means reduces the deadband through phase conjugate coupling of the first laser pulse and first counterpropagating laser pulse and faces the two first laser pulse and first counterpropagating laser pulse to couple at the absorption means.

19. The laser gyro apparatus of claim 18 wherein the lasing means comprises a laser source selected from the group of a laser diode, gas discharge laser, or a dye laser solid state gain media and generally broadened media.

20. The laser gyro apparatus of claim 11 wherein the shutter means is an acousto-optic modulator or electro-optic modulator.

* * * * *